United States Patent
Gilles

(10) Patent No.: US 8,168,457 B2
(45) Date of Patent: May 1, 2012

(54) SHAPED ARTICLES COMPRISING SEMICONDUCTOR NANOCRYSTALS AND METHODS OF MAKING AND USING SAME

(75) Inventor: Jennifer Z. Gilles, Petersburg, NY (US)

(73) Assignee: Nanoco Technologies, Ltd., Manchester (GB)

( * ) Notice: Subject to any disclaimer, the term of this patent is extended or adjusted under 35 U.S.C. 154(b) by 209 days.

(21) Appl. No.: 12/350,615

(22) Filed: Jan. 8, 2009

(65) Prior Publication Data

US 2009/0246900 A1    Oct. 1, 2009

Related U.S. Application Data

(62) Division of application No. 11/484,785, filed on Jul. 12, 2006, now abandoned.

(51) Int. Cl.
*H01L 21/02* (2006.01)
(52) U.S. Cl. ........... 438/30; 257/21; 257/43; 257/89; 257/E27.012; 257/E33.055; 977/773; 977/834; 438/42; 438/43; 438/52
(58) Field of Classification Search .......... 257/14–21, 257/42, 43, 89–98, E27.012, 33.013, 55–77; 438/30–52; 977/773, 834
See application file for complete search history.

(56) References Cited

U.S. PATENT DOCUMENTS

| 7,005,669 | B1* | 2/2006 | Lee .................. 257/21 |
| 2003/0226498 | A1 | 12/2003 | Alivisatos et al. |
| 2003/0235050 | A1 | 12/2003 | West et al. |
| 2005/0002635 | A1 | 1/2005 | Banin et al. |
| 2006/0081862 | A1 | 4/2006 | Chua et al. |
| 2007/0052004 | A1 | 3/2007 | Chao et al. |
| 2009/0321755 | A1* | 12/2009 | Jang et al. ........... 257/89 |
| 2010/0155749 | A1* | 6/2010 | Chen et al. .......... 257/89 |

FOREIGN PATENT DOCUMENTS
WO    2006017125 A2    2/2006

OTHER PUBLICATIONS

PCT Notification of Transmittal of the International Search Report and the Written Opinion of the International Searching Authority dated Oct. 27, 2008.
Tran, U.S. Appl. No. 11/484,785, Office Action Communication, May 28, 2008, 12 pages.

* cited by examiner

*Primary Examiner* — Michael Lebentritt
(74) *Attorney, Agent, or Firm* — Wong, Cabello, Lutsch, Rutherford & Brucculeri LLP

(57) ABSTRACT

A shaped article comprising a plurality of semiconductor nanocrystals. Devices incorporating shaped articles are also provided. Methods of manufacturing shaped articles by various molding processes are also provided.

21 Claims, 4 Drawing Sheets

SHAPED ARTICLES COMPRISING SEMICONDUCTOR NANOCRYSTALS AND METHODS OF MAKING AND USING SAME

CROSS REFERENCE TO RELATED APPLICATION

This application is a division of U.S. application Ser. No. 11/484,785, filed on Jul. 12, 2006, which is incorporated herein by reference in its entirety.

FIELD OF THE INVENTION

The present invention relates generally to shaped articles comprising semiconductor nanocrystals and methods of making and using the same.

BACKGROUND OF THE INVENTION

Semiconductor nanocrystals are typically tiny crystals of II-VI, III-V, IV-VI materials that have a diameter between 1 nanometer (nm) and 20 nm. In the strong confinement limit, the physical diameter of the nanocrystal is smaller than the bulk excitation Bohr radius causing quantum confinement effects to predominate. In this regime, the nanocrystal is a 0-dimensional system that has both quantized density and energy of electronic states where the actual energy and energy differences between electronic states are a function of both the nanocrystal composition and physical size. Larger nanocrystals have more closely spaced energy states and smaller nanocrystals have the reverse. Because interaction of light and matter is determined by the density and energy of electronic states, many of the optical and electric properties of nanocrystals can be tuned or altered simply by changing the nanocrystal geometry (i.e. physical size).

Single nanocrystals or monodisperse populations of nanocrystals exhibit unique optical properties that are size tunable. Both the onset of absorption and the photoluminescent wavelength are a function of nanocrystal size and composition. The nanocrystals will absorb all wavelengths shorter than the absorption onset, however, photoluminescence will always occur at the absorption onset. The bandwidth of the photoluminescent spectra is due to both homogeneous and inhomogeneous broadening mechanisms. Homogeneous mechanisms include temperature dependent Doppler broadening and broadening due to the Heisenburg uncertainty principle, while inhomogeneous broadening is due to the size distribution of the nanocrystals. The narrower the size distribution of the nanocrystals, the narrower the full-width half max (FWHM) of the resultant photoluminescent spectra.

Quantum yield (i.e. the percent of absorbed photons that are remitted as photons) is influenced largely by the surface quality of the nanocrystal. Photoexcited charge carriers will emit light upon direct recombination but will give up the excitation energy as heat if photon or defect mediated recombination paths are prevalent. Because the nanocrystal may have a large surface area to volume ratio, dislocations present on the surface or adsorbed surface molecules having a significant potential difference from the nanocrystal itself will tend to trap excited state carriers and prevent radioactive recombination and thus reduce quantum yield. It has been shown that quantum yield can be increased by removing surface defects and separating adsorbed surface molecules from the nanocrystal by adding a shell of a semiconductor with a wider bulk bandgap than that of the core semiconductor.

Inorganic colloids have been studied for over a century ever since Michael Faraday's production of gold sols in 1857. Rossetti and Brus began work on semiconductor colloids in 1982 by preparing and studying the luminescent properties of colloids consisting of II-VI semiconductors, namely cadmium sulfide (CdS). (Rossetti, R.; Brus L., Electron-Hole Recombination Emission as a Probe of Surface Chemistry in Aqueous CdS Colloids, *J. Phys. Chem.*, 86, 172 (1982), which is incorporated by reference herein. In that paper, they describe the preparation and resultant optical properties of CdS colloids, where the mean diameter of the suspended particles is greater than 20 nm. Because the sizes of the particles were greater than the exaction Bohr radius, quantum confinement effects that result in the blue shifting of the fluorescence peak was not observed. However, fluorescence at the bulk bandedge energies were observed and had a FWHM of 50-60 nm.

CdS colloids exhibiting quantum confinement effects (blue shifted maxima in the absorption spectra) were being prepared since 1984. (Fotjik A., Henglein A., *Ber. Bunsenges. Phys. Chem.*, 88, (1984); Fischer C., Fotjik A., Henglein A., *Ber. Bunsenges. Phys. Chem.*, (1986)). In 1987, Spanhel and Henglein prepared CdS colloids having mean particle diameters between 4 and 6 nm. (Spanhel L., Henglein A., Photochemistry of Colloidal Semiconductors, Surface Modification and Stability of Strong Luminescing CdS Particles, *Am. Chem. Soc.*, 109 (1987), which is incorporated by reference herein). The colloids demonstrated quantum confinement effects including the observation of size dependent absorption maxima (first exciton peaks) as well as size dependent fluorescent spectra. The colloids were prepared by bubbling a sulphur containing gas ($H_2S$) through an alkaline solution containing dissolved cadmium ions. The size and resultant color (of the fluorescence) of the resultant nanocrystals were dependent upon the pH of the solution. The colloids were further modified or "activated" by the addition of cadmium hydroxide to the solution that coated the suspended nanocrystals. The resultant core-shell nanocrystals demonstrated that the quantum yield of the photoluminescence was increased from under 1% to well over 50% with a FWHM of the photoluminescent spectra under 50 nm for some of the preparations.

Kortan and Brus developed a method for creating CdSe coated zinc sulphide (ZnS) nanocrystals and the opposite, zinc sulphide coated cadmium selenide nanocrystals. (Kortan R., Brus L., Nucleation and Growth of CdSe on ZnS Quantum Crystallite Seeds, and Vice Versa, in Inverse Micelle Media, *J. Am. Chem. Soc.*, 112 (1990), which is incorporated by reference herein). The preparation grew ZnS on CdSe "seeds" using a organometallic precursor-based reverse micelle technique and kept them in solution via an organic capping layer (thiol phenol). The CdSe core nanocrystals had diameters between 3.5 and 4 nm and demonstrated quantum confinement effects including observable exciton absorption peaks and blue shifted photoluminescence. Using another preparation, CdSe cores were coated by a 0.4 nm layer of ZnS. The photoluminescence spectra of the resultant core-shell nanocrystals indicates a peak fluorescence at 530 nm with an approximate 40-45 nm FWHM.

Murray and Bawendi developed an organometallic preparation capable of making CdSe, CdS, and CdTe nanocrystals. (Murray C., Norris D., Bawendi M., Synthesis and Characterization of Nearly Monodisperse CdE (E=S, Se, Te) Semiconductor Nanocrystallites, *J. Am. Chem. Soc.*, 115, (1993), which is incorporated by reference herein). This work, based on the earlier works of Brus, Henglein, Peyghambarian, allowed for the growth of nanocrystals having a diameter between 1.2 nm and 11.5 nm and with a narrow size distribution (<5%). The synthesis involved a homogeneous nucleation step followed by a growth step. The nucleation step is initiated by the injection of an organometallic cadmium precursor (dimethyl cadmium) with a selenium precursor (TOPSe-TriOctylPhosphine Selenium) into a heated bath containing coordinating ligands (TOPO-TriOctylPhosphineOxide). The precursors disassociate in the solvent, causing the cadmium and selenium to combine to form a growing nanocrystal. The TOPO coordinates with the nanocrystal to moderate and control the growth. The resultant nanocrystal solution showed an approximate 10% size distribution, however, by titrating the solution with methanol the larger nanocrystals could be selectively precipitated from the solution thereby reducing the overall size distribution. After size selective precipitation, the resultant nanocrystals in solution were monodisperse (capable of reaching a 5% size distribution) but were slightly prolate (i.e. nonspherical having an aspect ratio between 1.1 and 1.3). The photoluminescence spectra show a FWHM of approximately 30-35 nm and a quantum yield of approximately 9.6%.

Katari and Alivisatos slightly modified the Murray preparation to make CdSe nanocrystals. (Katari J., Alivisatos A., X-ray Photoelectron Spectroscopy of CdSe Nanocrystals with Applications to Studies of the Nanocrystal Surface, *J. Phys. Chem.*, 98 (1994), which is incorporated by reference herein). They found that by substituting the selenium precursor TOPSe with TBPSe (TriButylPhosphineSelenide), nanocrystals were produced that were monodisperse without size selective precipitation, were crystalline, and spherical. The nanocrystals were size tunable from 1.8 nm to 6.7 nm in diameter and had an exciton peak position ranging from 1.9-2.5 eV (corresponding to 635-496 nm wavelength). Like the Murray paper, TOPO was used as the coordinating ligand.

Hines and Guyot-Sionest developed a method for synthesizing a ZnS shell around a CdSe core nanocrystal. (Hines et al., Synthesis and Characterization of strongly Luminescing ZnS capped CdSe Nanocrystals, J. Phys. Chem., 100:468-471 (1996), which is incorporated by reference herein). The CdSe cores, having a monodisperse distribution between 2.7 nm and 3.0 nm (i.e. 5% size distribution with average nanocrystal diameter being 2.85 nm), were produced using the Katari and Alivisatos variation of the Murray synthesis. The photoluminescence spectra of the core shows a FWHM of approximately 30 nm with a peak at approximately 540 nm. The core CdSe nanocrystals were separated, purified, and resuspended in a TOPO solvent. The solution was heated and injected with zinc and sulphur precursors (dimethyl zinc and $(TMS)_2S$) to form a ZnS shell around the CdSe cores. The resultant shells were 0.6±0.3 nm thick, corresponding to 1-3 monolayers. The photoluminescence of the core-shell nanocrystals had a peak at 545 nm, FWHM of 40 nm, and a quantum yield of 50%.

Many of the above-described references describe methods of making luminescent semiconductor nanocrystals only and there remains a need for different uses and applications of semiconductor nanocrystals.

SUMMARY OF THE INVENTION

Shaped articles and methods of making and using the same are provided. In certain embodiments, the present invention provides a shaped article comprising a plurality of semiconductor nanocrystals. In certain embodiments, the present invention provides a method of manufacturing a shaped article. The method includes preparing a pre-form material by adding a plurality of semiconductor nanocrystals to a first material and forming the pre-form material into a shape article.

BRIEF DESCRIPTION OF THE DRAWINGS

The present invention is described throughout, including the following detailed description and the accompanying drawings. The description and the drawings are examples of the invention, numerous other embodiments are also possible. The drawings that accompany this specification are as follows.

DETAILED DESCRIPTION OF THE INVENTION

Figure 1:
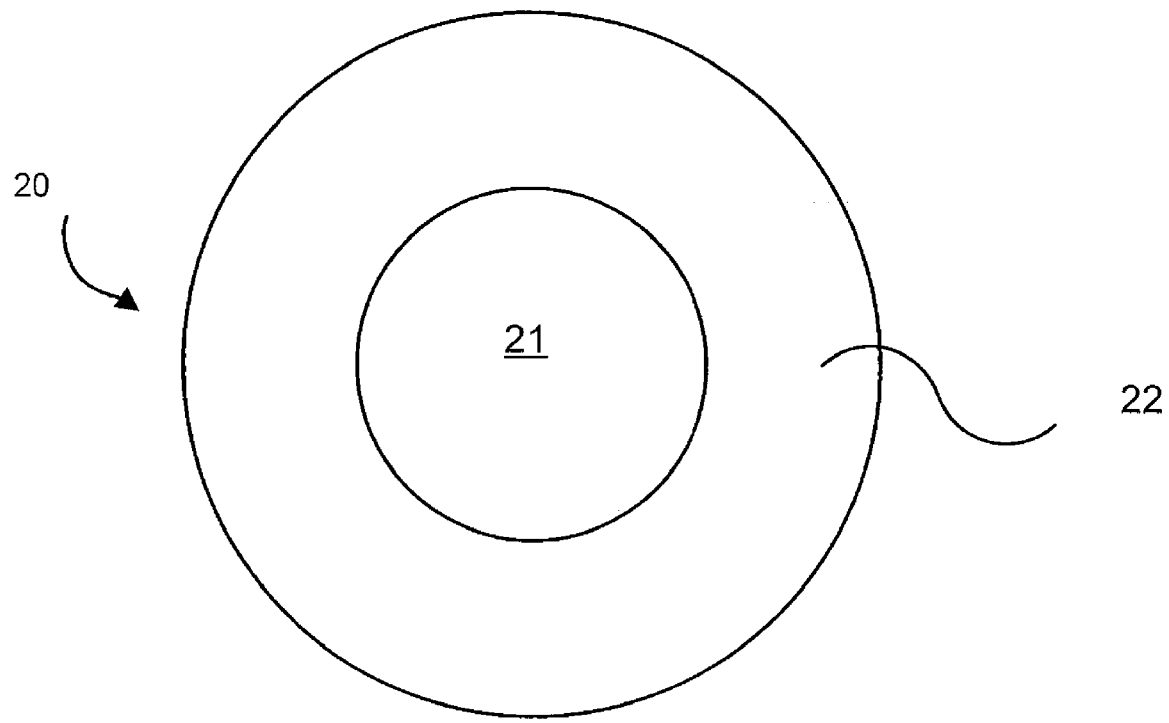
FIG. 1 is a schematic illustration of a semiconductor nanocrystal according to an embodiment of the present invention.

In certain embodiments, the present invention provides a shaped article comprising a plurality of semiconductor nanocrystals. As is generally known in the art, semiconductor nanocrystals are spherical nanoscale materials (although oblate and oblique spheroids can be grown as well as rods and other shapes) having a diameter between 1 nm and 20 nm and typically but not exclusively comprising II-VI, III-V, and IV-VI binary semiconductors. Referring to FIG. 1, in an embodiment, a semiconductor nanocrystal 20 according to the present invention includes a core 21 of a first semiconductor that has a selected composition and diameter that enables light emission at a predetermined wavelength and optionally one or more shells 22 of a second semiconductor preferably having a bulk bandgap greater than that of the first semiconductor of core 21. Optional one or more shells 22 is preferably between 0.1 nm and 10 nm thick. Non-limiting examples of semiconductor materials that may comprise core 21 include ZnS, ZnSe, ZnTe, CdS, CdSe, CdTe, HgS, HgSe, HgTe (II-VI materials), PbS, PbSe, PbTe (IV-VI materials), AlN, AlP, AlAs, AlSb, GaN, GaP, GaAs, GaSb, InN, InP, InAs, InSb (III-V materials) and alloys and combinations thereof. Non-limiting examples of materials that may comprise the one or more shells 22 include CdSe, CdS, CdTe, ZnS, ZnSe, ZnTe, HgS, HgSe, HgTe, InP, InAs, InSb, InN, GaN, GaP, GaAs, GaSb, PbSe, PbS, PbTe and alloys and combinations thereof.

Figure 2:
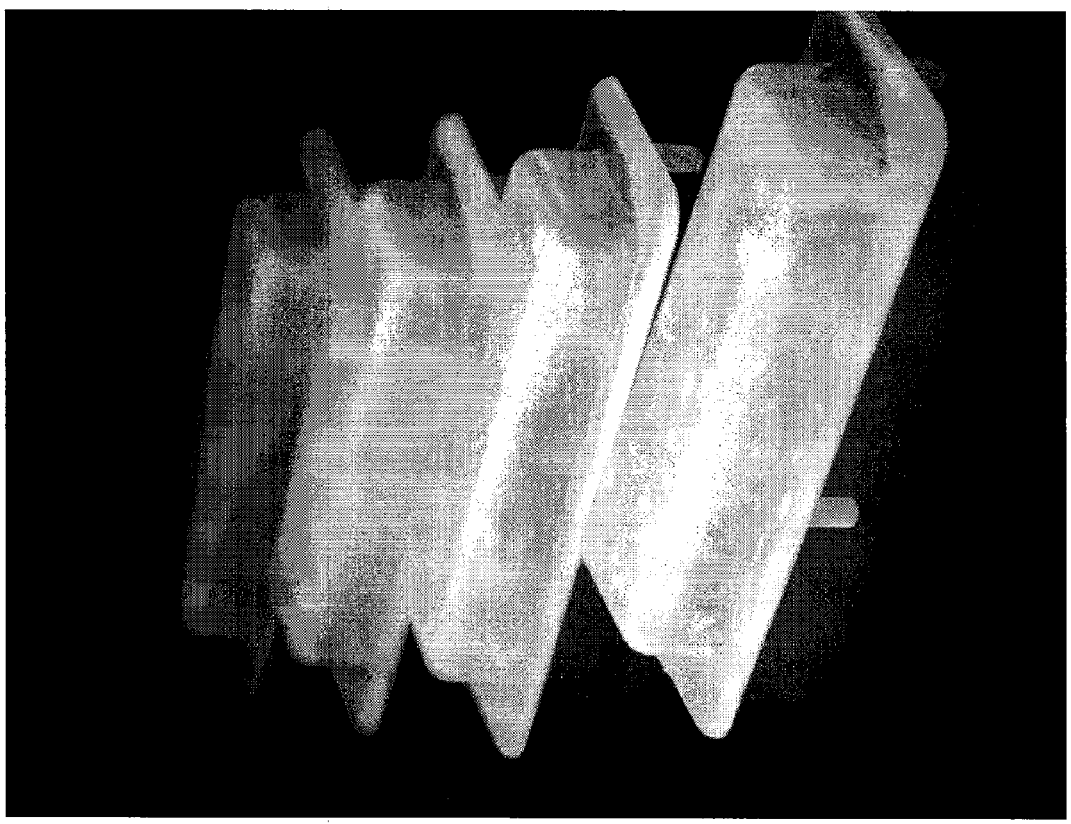
FIG. 2 is an image of a shaped article according to an embodiment of the present invention.

As used herein, a shaped article is an article that can be prepared by a molding technique. In general, a shaped article of the present invention can be manufactured by adding a plurality of semiconductor nanocrystals to a first material to make a pre-form material. The pre-form material is then formed into a shaped article. The pre-formed material can be formed into a shaped article by any suitable thermal and/or mechanical process known in the art, such as molding the pre-form material into a shaped article. Non-limiting examples of molding processes include injection molding, extrusion molding, blow molding, compression molding, contact molding, impression molding, press molding, and resin transfer molding. In a preferred embodiment, the pre-form material is formed into a shaped article by injection molding. Many such molding processes, particularly injection molding, allow for the production of a high volume of shaped articles and allow the semiconductor nanocrystals and the properties of the nanocrystals) to be incorporated into a wide range of materials with little or no finishing and minimal scrap losses. FIG. 2 depicts a shaped article made according to an embodiment of the present invention. The shaped article when illuminated emits light from the semiconductor nanocrystals contained in the shaped article.

Figure 3:
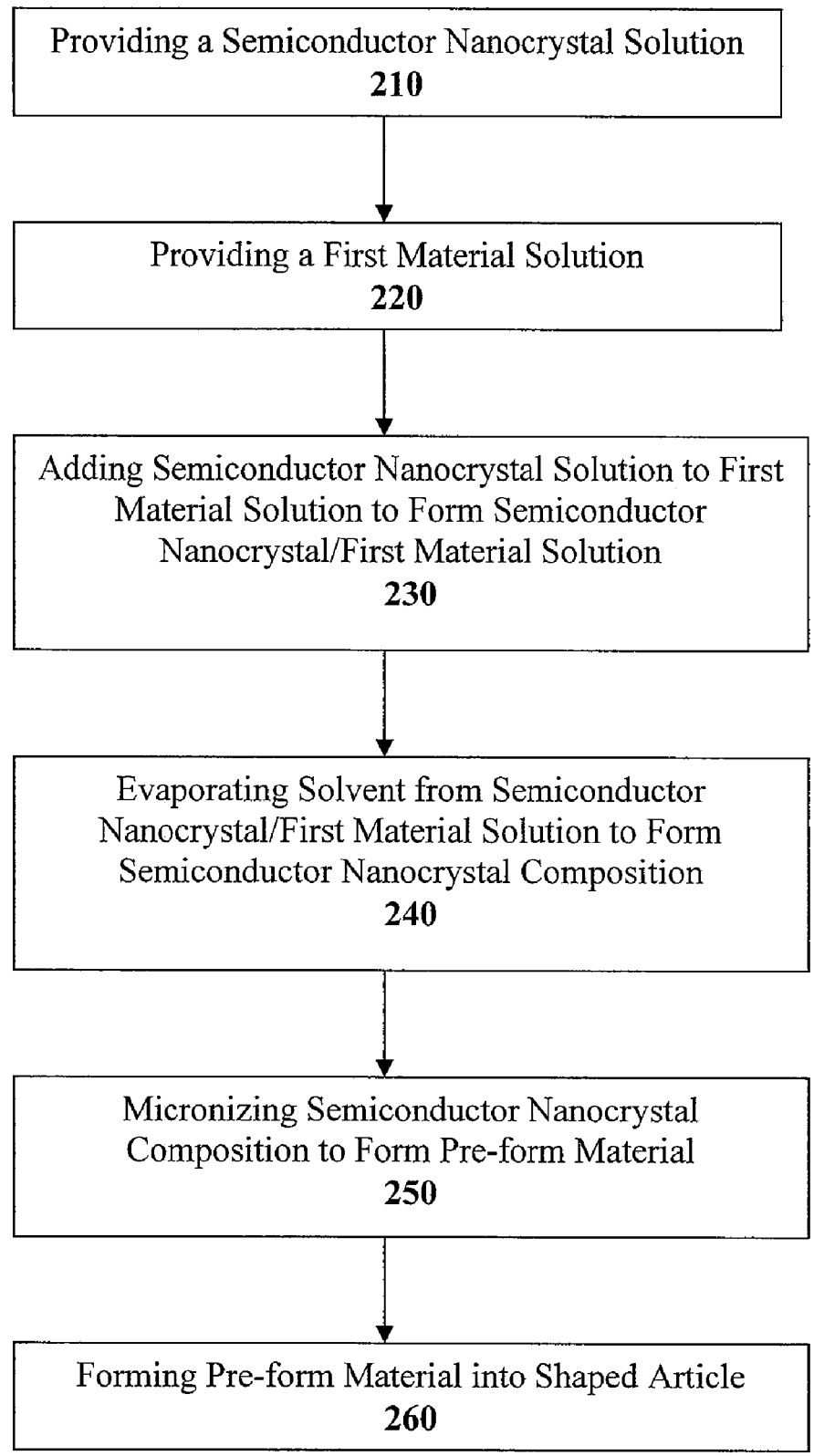
FIG. 3 is a flow chart illustrating an exemplary method of making a shaped article according to an embodiment of the present invention.

FIG. 3 depicts a flow chart illustrating an exemplary method of making a shaped article comprising semiconductor nanocrystals according to an embodiment of the present invention. In step 210, a plurality of semiconductor nanocrystals is obtained, for example, by preparing a plurality of semiconductor nanocrystals using any known method or purchasing a plurality of semiconductor nanocrystals (Evident Technologies, Troy, N.Y.). The plurality of semiconductor nanocrystals can be a plurality of the same semiconductor nanocrystals or two or more different semiconductor nanocrystals. For example, the two or more different semiconductor nanocrystals may include semiconductor nanocrystals comprising different cores and/or shells or semiconductor nanocrystals that luminance at different wavelengths. The plurality of semiconductor nanocrystals may be dissolved in any appropriate solvent, such as, for example, toluene to form a semiconductor nanocrystal solution or may be obtained already in solution.

In step 220, a first material is dissolved in the same type of solvent as is the plurality of semiconductor nanocrystals to form a first material solution. Non-limiting examples of materials that are soluble in toluene, a common solvent used in the preparation of semiconductor nanocrystals, include polystyrene, polymethylmethacrylate, polyacrylate, poly(n-butyl methacrylate and derivatives. The first material may be dissolved in the solvent by heating the solvent at approximately 110° C., for example, until the first material is dissolved to form a first material solution. It is appreciated that the temperature indicated for dissolving the first material is only exemplary and the proper temperature and time to dissolve may depend on the initial size of the first material, the temperature, as well as the type of first material used.

In step 230, the semiconductor nanocrystal solution obtained in step 210 is added to the first material solution obtained in step 220 to form a semiconductor nanocrystal/first material solution. In embodiments where the plurality of semiconductor nanocrystals is a plurality of two or more different semiconductor nanocrystals, the semiconductor nanocrystal solution comprising the plurality of two or more different semiconductor nanocrystals can similarly be added to first material solution to form a semiconductor nanocrystal/first material solution. Alternatively, each of the plurality of two or more different semiconductor nanocrystals may be separately dissolved a solvent and then each of the resultant semiconductor nanocrystal solutions can be added to the first material solution to form a semiconductor nanocrystal/first material solution. This solution is then mixed by simply stirring the solution, for example. Because the plurality of semiconductor nanocrystals and the first material are both soluble in the same solvent, the addition of the semiconductor nanocrystal solution to the first material solution allows the plurality of semiconductor nanocrystals to mix homogeneously with the first material.

In step 240, the solvent is evaporated out of the semiconductor nanocrystal/first material solution leaving a semiconductor nanocrystal composition comprising the plurality of semiconductor nanocrystals in the first material. In certain embodiments, the semiconductor nanocrystal composition comprises a first matrix material comprising a plurality of semiconductor nanocrystals. Initially, the solvent may be evaporated by heating the semiconductor nanocrystal/first material solution to 110° C., for example. The solution may then be poured in a tray and placed in a fume hood to evaporate all remaining solvent leaving a solid semiconductor nanocrystal composition that can constitute a pre-form material.

In certain embodiments, a method of the present invention further comprises step 250, in which the semiconductor nanocrystal composition from step 240 is processed further prior to shaping. For example, the semiconductor nanocrystal composition can be micronized prior to molding. In such embodiments, initially, the semiconductor nanocrystal composition can be blended to reduce the size of the composition. The desired size of the particles may vary depending on the equipment used to mold the pre-form material. For example, if injection molding is used, typically, injection molders are able to process particles (often referred to as pellets) from anywhere between a few microns to tens of centimeters. The semiconductor nanocrystal composition can be micronized by known techniques, such as, for example, blending, grinding, milling, and jet milling.

In certain embodiments, the pre-processing step 250 involves micronizing the semiconductor nanocrystal composition and then dispersing the micronized composition in a second material to make a pre-form material. Further, in certain embodiments, the pre-processing step involves micronizing a first semiconductor nanocrystal composition comprising a plurality of first semiconductor nanocrystals in a first material and micronizing a second semiconductor nanocrystal composition comprising a plurality of second, different semiconductor nanocrystals in a second material and then adding the first and second micronized semiconductor nanocrystal compositions to a base material to make a pre-form material. In any of the embodiments of the present invention, the pre-form material may comprise a plurality of the same semiconductor nanocrystals in a plurality of different materials, a plurality of different semiconductor nanocrystals in the same material, or a plurality of different semiconductor nanocrystals in a plurality of different materials. Other details regarding micronizing a semiconductor nanocrystal composition, can be found in co-pending U.S. application Ser. No. 11/175,196, filed on Jul. 7, 2005.

In certain embodiments where it is not desired for the semiconductor nanocrystal composition to be micronized or further processed, step 250 is not performed. In such embodiments, the semiconductor nanocrystal composition from step 240 constitutes a pre-form material that is subsequently shaped.

In step 260, the pre-form material is formed into a shaped article by any suitable molding process known in the art. For example, if injection molding is used, the pre-form material is injection molded into a shaped article. Typically, when injecting molding a material, the resin or raw material for injection molding is in pellet form and is melted by heat and shearing forces shortly before being injected into the mold. The pre-form material resulting from processing step 250 (the micronized semiconductor nanocrystal composition) may be used as a traditional injection moldable pellet. It is appreciated that in addition to adding processed pre-form material resulting from step 250, traditional pellets which may or may not be of the same material as that used for the manufacture of the pre-form material may be added during step 260. This can allow for the flexibility to control the concentration of semiconductor nanocrystals contained in the final shaped article.

In order to injection mold the pre-form material pellets (as well as any additional pellets that may be desired to be used), the pellets may be poured into a feed hopper, a large open bottomed container, which feeds the granules down to a screw. The screw may be turned by a hydraulic or electric motor that feeds the pellets through the grooves of the screw. As the screw rotates, the pellets may be moved forward in the screw and they undergo pressure and friction which generate the heat needed to melt the pellets. Heaters may be placed on either side of the screw to assist in heating the pellets during the melting process. The total energy provided during this step should not cause the semiconductor nanocrystals to degrade. Degradation may happen if the heat generated during formation is too high.

A hydraulic system may be used to secure the mold parts and the heated complex may be forced under the pressure of the injection screw to take the shape of the mold. Some machines are run by electric motors instead of hydraulics or a combination of both. Water-cooling can be may assist in cooling the mold and the heated complex solidifies into a shaped article. The shaped article may then be ejected (often with the assistance of an ejector pins within the mold).

Figure 4:
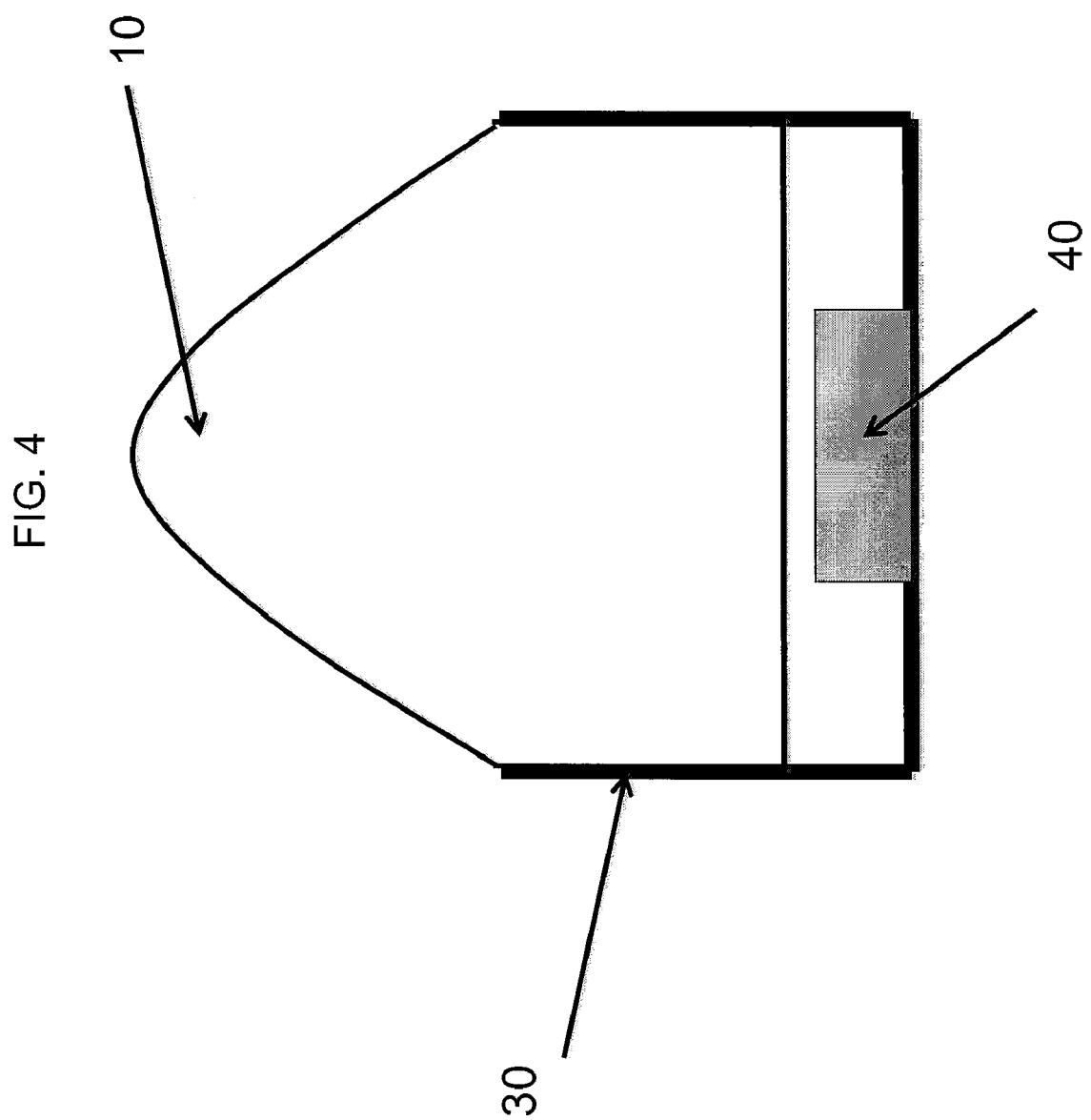
FIG. 4 is a schematic illustration of a shaped article in an LED cup.

The shaped articles comprising semiconductor nanocrystals of the present invention have several applications. For example, the shaped articles can be used in lighting applications, such as light emitting devices. For instance, shaped articles can be fashioned into a lens and/or cup for use in conjunction with a light emitting device. The semiconductor nanocrystals may be excited by the underlying light source and fluoresce at a desired wavelength. For example, referring to FIG. 4, in an embodiment, a shaped article 10 could be in a light emitting diode cup 30 that includes an underlying light source 40. In this way, a user may take advantage of the fluorescent properties of the underlying semiconductor nanocrystals without substantially altering the manufacturing process for the existing LED devices.

In this manner, visibly emitting semiconductor nanocrystals such as, for example, CdS, CdSe, CdTe, InP, InN, ZnSe, may be added to a material that is then shaped into a lens or cup. Presently, white light emitting diodes typically are excited by a 460-480 nm InGaN emitter with a cerium doped yttrium aluminum garnet (YAG) phosphor placed on top of the light emitting diodes. Often, light emitting diodes made by this technique are too blue, especially for general illumination. The shaped articles of the present invention can form a cup of an LED device or be placed into the cup of an LED device (or a lens for use with such device) can be used in addition to or instead of YAG phosphors to create a light with more red emission. For example, in addition to the YAG phosphors, red emitting CdS nanocrystals injected molded into an LED cup may be used instead of a traditional LED cup. It is appreciated that the disclosed use of the articles of the present invention can work not only for light emitting diodes but also other lighting applications such as plasma displays, fluorescent lighting, or with any other blue or ultra violet source emitter. It is further appreciated that red, green and blue emitting shaped articles of the present invention or other combinations of wavelengths can be placed on top of an ultraviolet emitting diode to create a white light emitting diode.

In certain embodiments, shaped articles of the present invention can also be used as light scatterers in lighting applications. Traditional semiconductor nanocrystals when uniformly dispersed throughout a solution or matrix do not scatter light due to their extremely small size. Some lighting applications using phosphors require scattering to ensure an optimized absorbance and optimized white light emission. The shaped articles of the present invention can be used to create isotropic light emission. In this instance, the first material may be, for example, silica sol-gel that does not degrade under blue or UV excitation. Although, some optical epoxies do not degrade under blue or UV excitation, such optical epoxies have been shown to be incompatible with semiconductor nanocrystals. The shaped articles of the present invention comprising semiconductor nanocrystals can be placed into or comprise optical epoxies to scatter light and be excitable by blue or UV excitation.

Shaped articles of the present invention can also have many uses in security applications. For example, shaped articles comprising semiconductor nanocrystals emitting in the infrared range can be used for authentication purposes, providing a unique optical signature for the identification of the articles. Additionally, shaped articles comprising a plurality of CdSe nanocrystals emitting at various red, green and blue can be mixed together to make a visibly emitting spectral bar code that can be detected with a spectral bar code reader. It is appreciated that more than one type of semiconductor nanocrystal may be used in the same shaped article.

In an exemplary embodiment, a shaped article is manufactured using semiconductor nanocrystals comprising PbS nanocrystals in a polystyrene matrix material that is processed with traditional materials used to make the desired shaped article. In such an embodiment, the shaped article contains the fluorescent signature of the underlying PbS semiconductor nanocrystals and is able to be authenticated through the use of a reader.

In certain embodiments, shaped articles of the present invention can be used in the preparation of luminescent concentrator solar cells. Luminescent concentrator solar cells may have light absorbing materials incorporated into a polymer or silicone layer. These materials act to absorb light from the sun and transmit the energy emitted by the light absorbing materials to a photovoltaic device optically coupled to the material. A shaped article of the present invention may be prepared such that the semiconductor nanocrystals absorb at least a portion of the light emitting by the sun and the material containing the semiconductor nanocrystals may be selected such that it efficiently transmits the energy emitted by these nanocrystals. In fact, the material used in the preparation of the shaped article may be the polymers or silicones that are presently used to create a luminescent concentrator solar cell. For example, the nanocrystals may be incorporated into a polycarbonate matrix material which may efficiently transmit the energy generated by the semiconductor nanocrystals to a photovoltaic device.

EXAMPLES

Example 1

The following example describes a process for preparing a shaped article comprising a plurality of CdS nanocrystals and a first matrix material that is polystyrene.

CdS/ZnS core/shell nanocrystals are purchased in toluene (Evident Technologies, Troy, N.Y.). After the polystyrene is dissolved, 1.0 g of CdS/ZnS semiconductor nanocrystals are added to the solution and mixed. Next, the toluene is evaporated by heating the solution to 110.6° C. until the total volume is reduced to approximately 500 mL. The solution is then poured into a 9×13 inch Pyrex tray, and placed in a fume hood overnight to allow for most of the solvent to evaporate. The remaining solvent is removed using a vacuum oven (50° C.) resulting in formation of a polymer/semiconductor nanocrystal solid composition. This resulting semiconductor nanocrystal composition is then processed in a blender and micronized to the desired size to form a pre-form material that is micronized. The pre-formed material is placed in an injection molded machine and injection molded into a shaped article. The shaped article retained the luminescent and absorption properties of the underlying semiconductor nanocrystal.

Example 2

The following example describes a process for preparing a shaped article comprising a plurality of two different semiconductor nanocrystals (PbS and CdSe/ZnS nanocrystals) in a first material that is polystyrene.

PbS and CdSe/ZnS nanocrystals are purchased in toluene (Evident Technologies, Troy, N.Y.). 99 g of polystyrene are dissolved in 1.0 L of toluene at 110.6° C. (boiling). After the polystyrene is dissolved, 0.5 g of PbS semiconductor nanocrystals and 0.5 g of CdSe/ZnS nanocrystals are added to the solution and mixed. Next, the toluene is evaporated by heating the solution to 110.6° C. until the total volume is reduced to approximately 500 mL. The solution is then be poured into a 9×13 inch Pyrex tray, and placed in a fume hood overnight to allow most of the solvent to evaporate. The remaining solvent is removed using a vacuum oven (50° C.) resulting in formation of a polymer/semiconductor nanocrystal solid composition. This resulting solid composition is then micronized in a blender to the desired size to form a pre-form material that is micronized. The pre-form material is placed in an injection molded machine and injection molded into an article. The article retained the luminescent and absorption properties of the underlying semiconductor nanocrystal complexes.

The foregoing description and examples have been set forth merely to illustrate the invention and are not intended as being limiting. Each of the disclosed aspects and embodiments of the present invention may be considered individually or in combination with other aspects, embodiments, and variations of the invention. In addition, unless otherwise specified, none of the steps of the methods of the present invention are confined to any particular order of performance. Modifications of the disclosed embodiments incorporating the spirit and substance of the invention may occur to persons skilled in the art and such modifications are within the scope of the present invention. Furthermore, all references cited herein are incorporated by reference in their entirety. Moreover, it is appreciated, that although a number of problems and deficiencies may be identified herein, each embodiment may not solve each problem identified in the prior art. Additionally, to the extent a problem identified in the prior art or an advantage of the present invention is cured, solved, or lessened by the claimed invention, the solution to such problems or the advantage identified should not be read into the claimed invention.

What is claimed is:

1. A method of manufacturing a shaped article comprising a plurality of semiconductor nanocrystals, comprising:
   (1) preparing a pre-form material by adding a plurality of semiconductor nanocrystals to a first material; and
   (2) molding the pre-form material into the shape article, wherein the molding includes molding the pre-form material using at least one method selected from a group consisting of: injection molding, extrusion molding, blow molding, compression molding, contact molding, impression molding, press molding, and resin transfer molding.

2. The method of claim 1, wherein the plurality of semiconductor nanocrystals comprises a PbS core.

3. The method of claim 1, wherein the shaped article is a lens.

4. The method of claim 1, wherein the shaped article is in a light emitting diode cup.

5. A method of manufacturing a light emitting diode comprising the method of claim 3 and further comprising incorporating the shaped article into a light emitting diode.

6. A method of manufacturing a light emitting diode comprising the method of claim 4 and further comprising incorporating the shaped article into a light emitting diode.

7. The method of claim 1, wherein the shaped article comprises optical epoxy.

8. The method of claim 1, wherein upon excitation the shaped article emits light in the infra-red range.

9. The method of claim 1, wherein the shaped article is a layer of a solar cell.

10. A method of manufacturing a solar cell comprising the method of claim 9 and further comprising incorporating the shaped article into a solar cell.

11. The method of claim 1, wherein the first material is a matrix material.

12. The method of claim 1, wherein the first material is a polymer.

13. The method of claim 1, wherein the plurality of semiconductor nanocrystals is a plurality of two or more different semiconductor nanocrystals.

14. The method of claim 11, wherein step (1) comprises: dissolving the first matrix material in a solvent to form a first matrix material solution; dissolving the plurality of semiconductor nanocrystals in the same solvent to form a semiconductor nanocrystal solution; mixing the first matrix material solution and the semiconductor nanocrystal solution to form a semiconductor nanocrystal-first matrix material solution; evaporating the solvent from the semiconductor nanocrystal-first matrix material solution to form the pre-form material.

15. The method of claim 11, wherein step (1) comprises: dissolving the first matrix material in a solvent to form a first matrix material solution; dissolving the plurality of semiconductor nanocrystals in the same solvent to form a semiconductor nanocrystal solution; mixing the first matrix material solution and the semiconductor nanocrystal solution to form a semiconductor nanocrystal-first matrix material solution; evaporating the solvent from the semiconductor nanocrystal-first matrix material solution to form a solid semiconductor nanocrystal composition; and micronizing the solid semiconductor nanocrystal composition to make the pre-form material.

16. The method of claim 11, wherein step (1) comprises: dissolving the first matrix material in a solvent to form a first matrix material solution; dissolving a plurality of semiconductor nanocrystals in the same solvent to form a semiconductor nanocrystal solution; mixing the first matrix material solution and the semiconductor nanocrystal solution to form a semiconductor nanocrystal-first matrix material solution; evaporating the solvent from the semiconductor nanocrystal-first matrix material solution to form a solid semiconductor nanocrystal-first matrix material composite; and micronizing the solid semiconductor nanocrystal-first matrix material composite to form a micronized semiconductor nanocrystal-first matrix material composite; and dispersing the micronized semiconductor nanocrystal-first matrix material composite in a second matrix material to make the pre-form material.

17. The method of claim 16, wherein the first matrix material is a silica sol-gel.

18. The method of claim 16, wherein the second matrix material is an optical epoxy.

19. The method of claim 11, wherein step (1) comprises: dissolving the first matrix material in a solvent to form a first matrix material solution; dissolving a plurality of first semiconductor nanocrystals and a plurality of second, different semiconductor nanocrystals in the same solvent to form a semiconductor nanocrystal solution; mixing the first matrix material solution and the semiconductor nanocrystal solution to form a semiconductor nanocrystal-first matrix material solution; evaporating the solvent from the semiconductor nanocrystal-first matrix material solution to form a solid semiconductor nanocrystal composition; and micronizing the solid semiconductor nanocrystal composition to make the pre-form material.

20. The method of claim 11, wherein step (1) comprises: adding a plurality of first semiconductor nanocrystals to the first matrix material to form a first mixture; micronizing the first mixture; adding a plurality of second, different semiconductor nanocrystals to a second matrix material to form a second mixture; micronizing the second mixture; and adding the micronized first mixture and the micronized second mixture to a base matrix material to make the pre-form material.

21. The method of claim 1, wherein forming the pre-form material comprises injection molding the pre-form material.

* * * * *